United States Patent [19]
Roth

[11] Patent Number: 5,932,280
[45] Date of Patent: *Aug. 3, 1999

[54] PRINTED CIRCUIT BOARD HAVING PRINTED RESISTORS AND METHOD OF MAKING PRINTED RESISTORS ON A PRINTED CIRCUIT BOARD USING THERMAL TRANSFER TECHNIQUES

[75] Inventor: Joseph D. Roth, Springboro, Ohio

[73] Assignee: NCR Corporation, Dayton, Ohio

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/574,736

[22] Filed: Dec. 19, 1995

[51] Int. Cl.⁶ ............................................. B05D 5/12
[52] U.S. Cl. ........................... 427/102; 427/101; 427/146
[58] Field of Search ........................... 361/766; 174/260; 427/101, 102, 146

[56] References Cited

U.S. PATENT DOCUMENTS

| 3,909,680 | 9/1975 | Tsunashima | 361/748 |
| 4,722,765 | 2/1988 | Ambros et al. | 156/630 |
| 4,991,287 | 2/1991 | Piatt et al. | 29/840 |
| 5,379,190 | 1/1995 | Hanamura et al. | 361/766 |
| 5,826,329 | 10/1998 | Roth | 29/846 |

Primary Examiner—Brian K. Talbot
Attorney, Agent, or Firm—Charlene Stukenborg

[57] ABSTRACT

Resistors for a printed circuit board and methods for making are provided using thermal transfer techniques to transfer coating material having some degree of electrical conductivity from a thermal transfer ribbon to the printed circuit board. Parts of the coating material transferred to the printed circuit board form resistors having varying resistances based on the geometry of the material transferred. Multiple ribbons having coatings with varying degrees of electrical conductivity may also be used to provide greater variances in resistor values obtainable.

15 Claims, 4 Drawing Sheets

PRINTED CIRCUIT BOARD HAVING PRINTED RESISTORS AND METHOD OF MAKING PRINTED RESISTORS ON A PRINTED CIRCUIT BOARD USING THERMAL TRANSFER TECHNIQUES

BACKGROUND OF THE INVENTION

The present invention relates to new and novel improvements in printed circuit boards, and is particularly directed to printed circuit boards having printed resistors and methods of printing resistors on a printed circuit board using thermal transfer techniques.

A typical printed circuit board has discrete resistors placed thereon. Discrete resistors may include ceramic resistors and/or resistors formed on integrated circuit chips. Use of separate components, such as discrete resistors, increases the overall costs associated with producing printed circuit boards with electrical components.

SUMMARY OF THE INVENTION

In accordance with the teachings of the present invention, resistors are printed on printed circuit boards using thermal transfer techniques. An electrically conductive material is formulated in a coating portion of a thermal transfer ribbon so the coating has some degree of electrical conductivity. Heat from a thermal printhead is applied to a portion of the ribbon and causes a part of the coating to transfer from the ribbon to a printed circuit board, forming at least a part of a printed resistor. The resistance value may be changed by varying the geometry of the coating deposited according to a first embodiment. In a second embodiment, multiple thermal transfer ribbons having coatings with varying degrees of electrical conductivity are provided, and the resistance value may be changed by using coatings from the various ribbons as well as varying the geometries of the coatings deposited.

An object of the present invention is to provide printed resistors which eliminate the need to provide discrete resistors on a printed circuit board.

Another object of the present invention is to provide a printed circuit board having resistors formed of coating material having some degree of electrical conductivity with the coating being transferred from a thermal transfer ribbon.

These and other objects of the present invention are attained by printing resistors on printed circuit boards using thermal transfer techniques including using a thermal transfer ribbon having a coating material having some degree of electrical conductivity.

Other objects, advantages and novel features of the present invention will become apparent in the following detailed description of the invention when considered in conjunction with the accompanying drawings.

DETAILED DESCRIPTION

Figure 1:
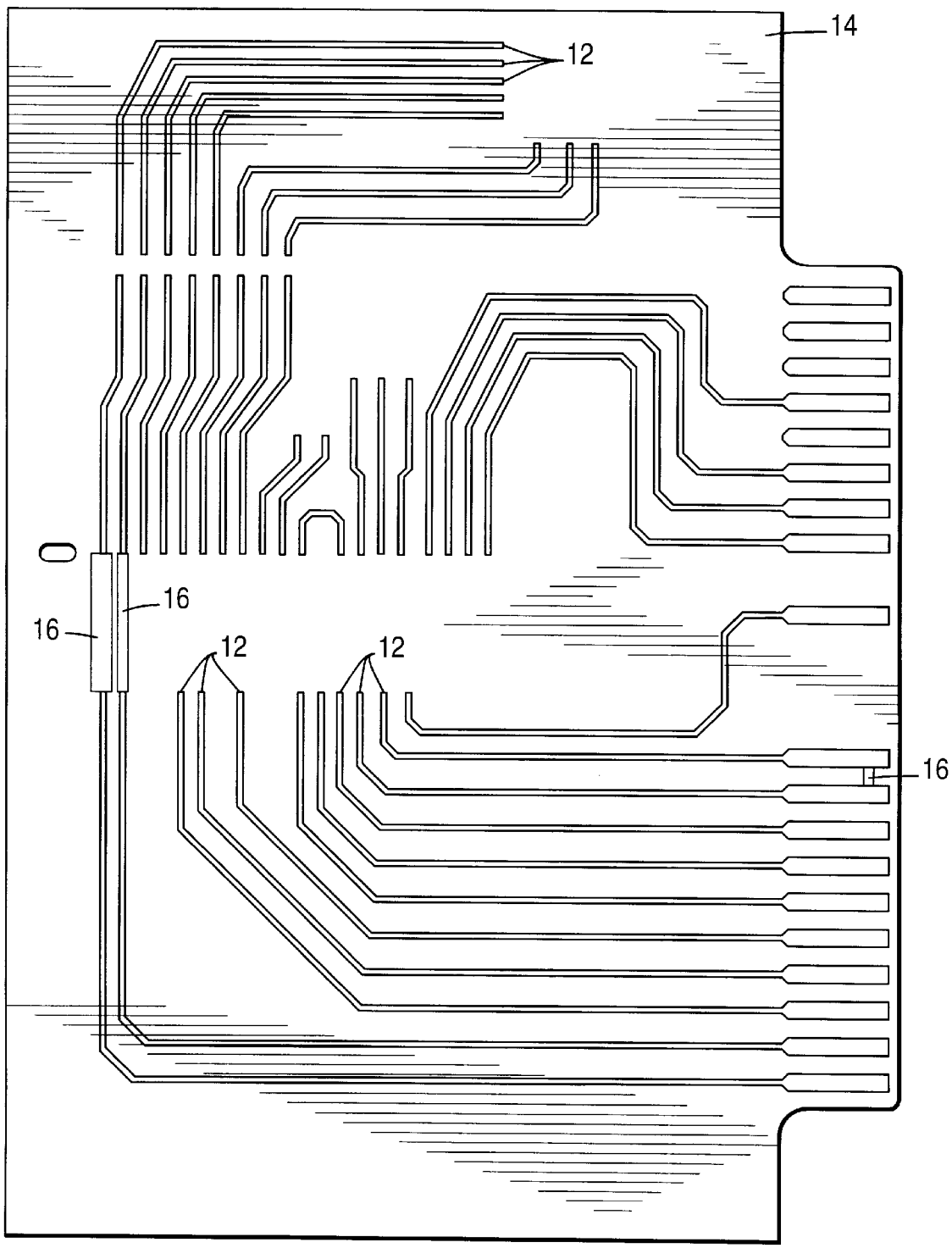
FIG. 1 is a schematic view of a printed circuit board having resistors printed thereon in accordance with the present invention.

The present invention is directed to a printed circuit board having resistors printed thereon and methods of printing the resistors on the printed circuit board. A printed circuit board 10 having resistors 16 printed thereon in accordance with the present invention is illustrated in FIG. 1.

The printed circuit board 10 comprises a receiver board 14 and electrically conductive traces 12. Receiver board 14 is preferably a fiberglass board or laminate. Electrically conductive traces 12 may be copper traces formed according to a print and etch process as is well known.

The printed circuit board 10 further includes a number of printed resistors 16. Each resistor 16 may vary in geometry, particularly width, depending on the resistance value desired. Each resistor 16 is printed between electrically conductive traces 12 on the printed circuit board 10. The method of making each of the resistors 16 is the same. For simplicity, only one of the resistors 16 will be described.

Figure 2:
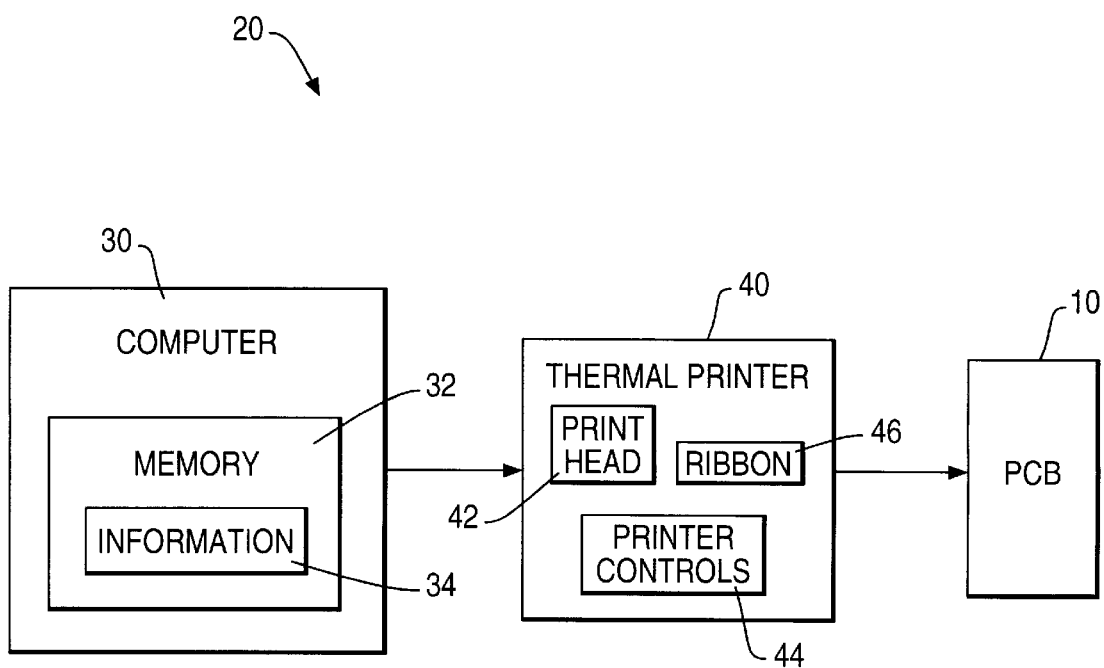
FIG. 2 is a block diagram of a computer system for producing the printed resistors on the printed circuit board of FIG. 1.

The resistor 16 is printed on the printed circuit board 10 using a computer system 20 as shown in FIG. 2. Computer system 20 includes a computer 30 containing memory 32 for storing information 34 relating to the location and geometry of the resistor 16. The information 34 stored in memory 32 may be input from an external device such as a floppy disk. Alternatively, the information 34 may be generated by a design program installed in computer 30.

Computer system 20 further includes a thermal printer 40. The printer 40 includes a thermal printhead 42 and printer controls 44 which receive the information 34 from the computer 30 and use the information 34 to instruct the printhead 42. Printer 40 may be any type of thermal transfer printer or hot stamp machine which can accomodate printing on a flat or relatively inflexible medium such as the printed circuit board 10 of FIG. 1 (as shown in FIG. 2). An example of such a thermal transfer printer is the TEC B-872 Thermal Printer made by TEC America, Inc., Corporate Office, 4401-A Bankers Circle, Atlanta, Ga. 30360. A customized thermal printer could also be used if circuit requirements dictate a more precise system.

Figure 3:
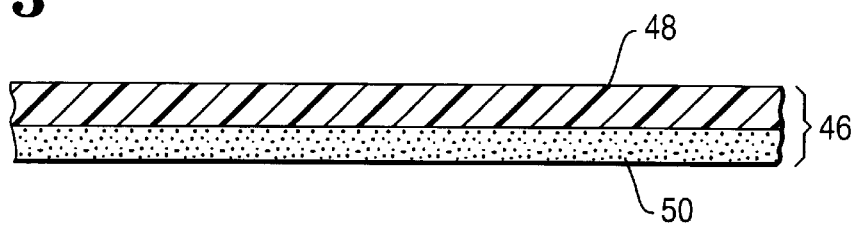
FIG. 3 is a sectional view of a thermal transfer ribbon used to make the printed resistors of FIG. 1.

The printer 40 includes a thermal transfer ribbon 46, as shown in FIGS. 2 and 3. Thermal transfer ribbon 46 is formed by known processes and comprises a base or substrate 48 and a coating 50 disposed on the substrate. Base or substrate 48 is a thin, smooth, tissue-type paper or polyester-type plastic, or like material. Coating 50 is thermally activated. Coating 50 may include waxes, resins and pigments. Coating 50 can be formulated with conducting polymer such as poly(sulfur nitride), also known as polythiazyl, and cis-polyacetylene doped with $AsF_5$. Coating 50 can also be formulated using non-conducting polymer filled with conducting pigments such as electrically conductive carbon black, powder copper, powder nickel, powder aluminum or powder silver.

The electrically conductive material is fairly uniformly dispersed throughout the coating material. This uniformity provides a fairly consistent resistance value when a particular geometry is specified. Coating 50 has some degree of electrical conductivity. The percentage of the conductive material determines the degree of electrical conductivity and thus, the degree of resistivity.

The specific formulation of the coating 50 may vary. An example of a formulation of the coating 50 is provided in the following table of ingredients.

TABLE OF INGREDIENTS

|  | Use | % Dry | Dry (g) | Wet (g) |
| --- | --- | --- | --- | --- |
| Butyl Acetate | Solvent | NA | NA | 300.0 |
| Diglycidyl ether bisphenol A (DGEBA) | Binder/Epoxy | 50.0 | 37.5 | 37.5 |
| Novolac epoxy | Binder/Epoxy | 5.0 | 3.7 | 3.7 |
| Modified Polyamine | Hardener | 10.0 | 7.5 | 7.5 |
| Non-conductive Carbon Black | Pigment | 0–35.0 | 0–26.3 | 0–26.3 |
| Conductive Carbon Black | Conductive Particle | 0–35.0 | 0–26.3 | 0–26.3 |

In the above formulation, the percentage of non-conductive carbon black and conductive carbon black can be varied to provide a coating with different degrees of electrical conductivity. In the above formulation, the total percentage of non-conductive carbon black and conductive carbon black equals about 35.0% by weight of the coating 50.

Also, in the above formulation, the diglycidyl ether bisphenol A (DGEBA) is marketed as "Araldite GT7013" by Ciba-Geigy Corporation in Hawthorne, N.Y. The novolac epoxy is marketed as "Epon 164" by Shell Chemical Co. in Houston, Tex. The modified polyamine is marketed as "Ancamine 2014FG" by Air Products in Allentown, Pa. The electrically conductive carbon black is marketed as "Conductex SC" by Columbia Chemicals in Atlanta, Ga. The electrically non-conductive carbon black is marketed as "Raven Bead 1255" by Cabot Corporation, 125 High Street, Boston, Mass. The backing element is marketed as "Polyester Mylar Film" by E. I. Dupont de Nemours & Co., Incorporated in Wilmington, Del.

To make the coating 50, dissolve DGEBA and novolac epoxy in solvent. Add modified polyamine under agitation to provide a mixture. Transfer the mixture to the vessel of an attritor with a cooling jacket. Start the attritor (200–250 rpm) and add both conductive and non-conductive carbon black, ensuring that the temperature of the content in the vessel does not exceed 120° F. Grind for two hours to provide a coating mixture. Apply the coating mixture to a substrate such as Polyester terephthalate (PET) film with a coat weight of 1.2 g/m$^2$ to 45 g/m$^2$. The thermal transfer ribbon 46 is formed when the coating mixture applied to the substrate dries. The coating should not exceed 120° F. during drying.

Figure 4:
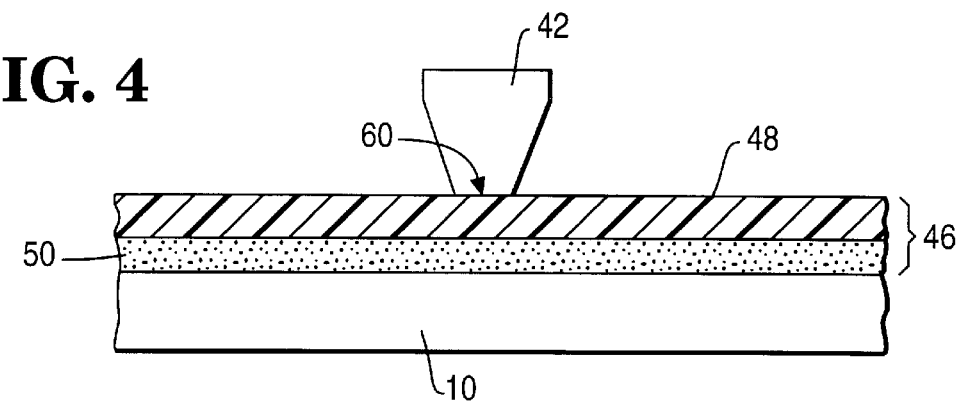
FIG. 4 is a sectional view of the thermal transfer ribbon of FIG. 3 in contact with a printhead of the computer system of FIG. 2.

To make a printed resistor 16 on the printed circuit board 10, the thermal transfer ribbon 46 is first positioned over the printed circuit board 10 as shown in FIG. 4. The computer 30 communicates with the printer controls 44, sending the information contained in memory 32 indicating the location and geometry of the resistor to be printed on the printed circuit board 10. As instructed by printer controls 44, the printhead 42 moves along the ribbon 46 until the printhead 42 is positioned above a portion 60 of the ribbon as shown in FIG. 4. Printhead 42 includes heating elements, such as fast response thin film resistors. Intense heating of selected heating elements of the printhead 42 causes the transfer of part of the coating 50 from the ribbon 46 onto printed circuit board 10. The number and location of selected heating elements in the printhead 42 determines the geometry and location of the part of the coating transferred to printed circuit board 10.

Figure 5:
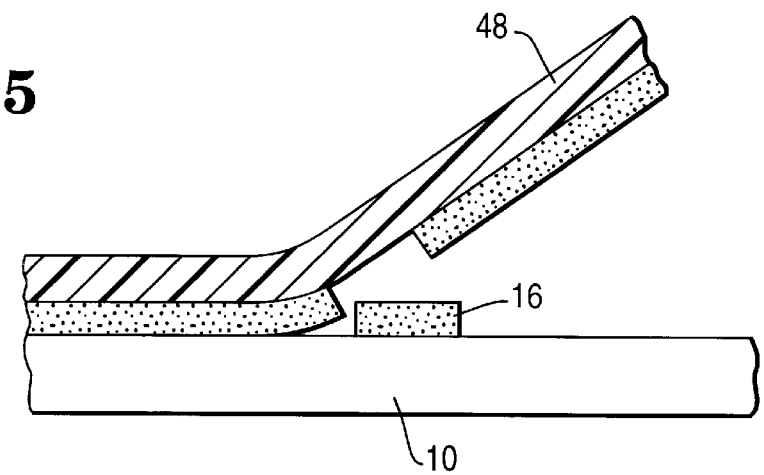
FIG. 5 is a sectional view similar to FIG. 4 and showing a part of a coating of the ribbon of FIG. 3 transferred to the printed circuit board of FIG. 1.
Figure 6:
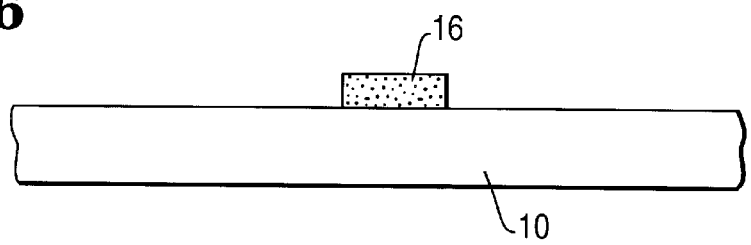
FIG. 6 is a sectional view similar to FIG. 5 and showing the remaining ribbon moved away from the printed circuit board.

After the printhead 42 applies heat to the portion 60 of ribbon 46, the ribbon 46 as shown in FIG. 4 is pulled away from printed circuit board 10 and moved to a position such as that shown in FIG. 5. When the ribbon 46 is moved away from the position as shown in FIG. 4 to the position as shown in FIG. 5, part 16 (FIG. 5) of the coating 50 remains adhered to the printed circuit board 10 due to the heat being applied to the portion 60 of the ribbon. As a result of the ribbon being moved away from the portion shown in FIG. 5, the ribbon becomes a used ribbon. The used ribbon shown in FIG. 5 continues to move away from the printed circuit board 10 until it is completely moved away as shown in FIG. 6. The part 16 of the coating 50 remaining on the printed circuit board 10, as shown in FIG. 6, then cools to form at least part of the resistor 16 as shown in FIG. 1.

The above steps of positioning the printhead 42 over the portion 60 of the ribbon 46, applying heat to the portion 60 of the ribbon 46, and causing the part 16 of the coating 50 to transfer to printed circuit board 10 are repeated until all parts of the desired resistor have been printed on the printed circuit board 10. It is possible that the desired resistor may be formed upon completing the above steps only once.

The above described process to make one resistor is continued until all desired resistors have been formed on the printed circuit board 10. The width of the printed resistor can be varied. However the length of the resistor may be determined by the electrical traces to be connected. The geometry of each printed resistor 16 must be such that the resistor connects the desired electrical traces 12 with the desired resistance.

Although the foregoing describes a method for printing resistor 16 on the printed circuit board having electrically conductive traces 12 thereon, it is contemplated that the method described above may also be used to print the electrically conductive traces 12 on substrate 14. A ribbon having a high degree of electrical conductivity would be used.

A number of advantages result by printing resistors on a printed circuit board in accordance with the present invention as described hereinabove. One advantage is that the costs associated with providing discrete resistors for a printed circuit board are eliminated. Another advantage is that printed resistors 16 are a low cost means for providing resistors of a rough tolerance for applications such as games, etc. which do not require precise resistance values.

Figure 7:
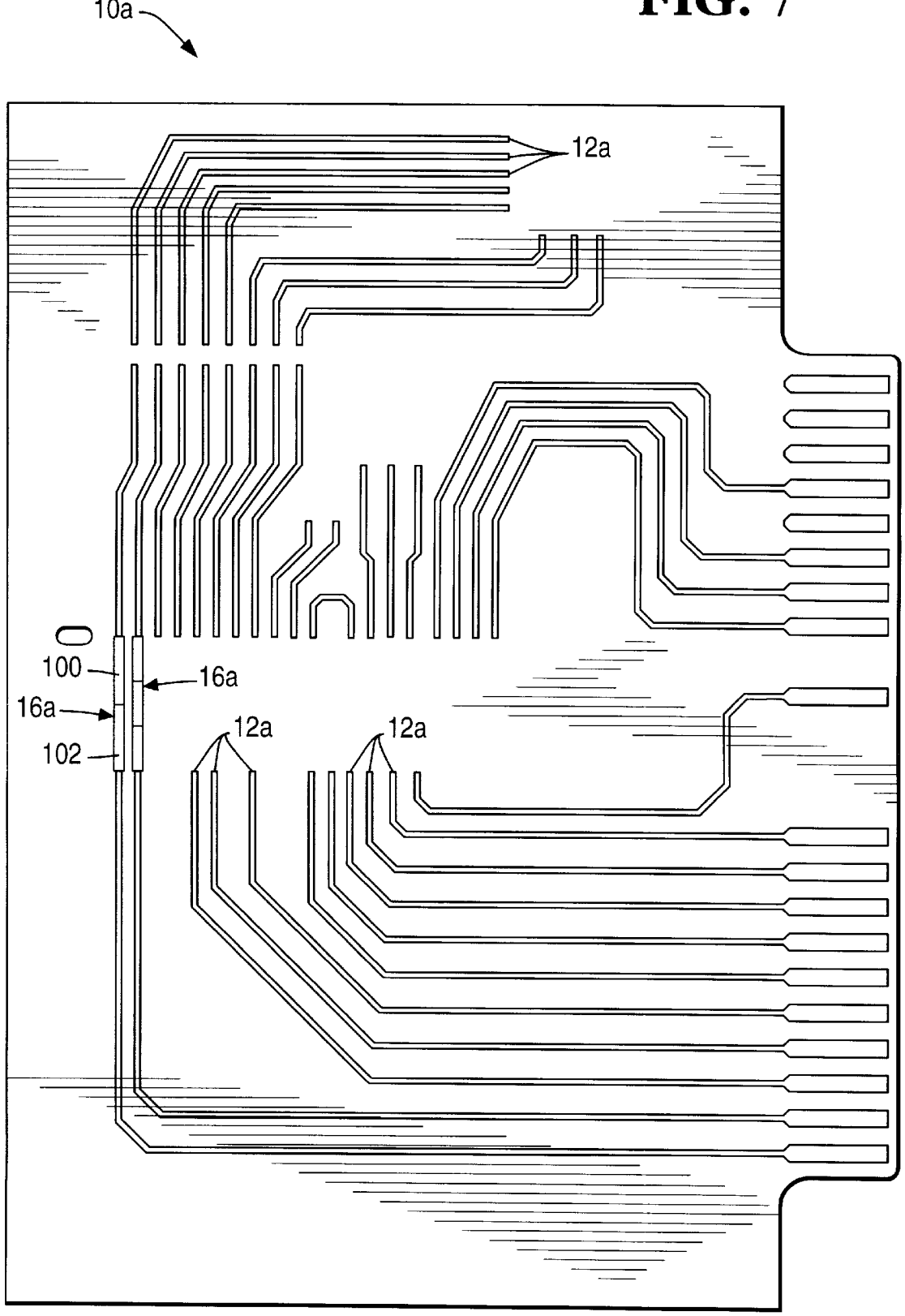
FIG. 7 is a schematic view similar to FIG. 1 and showing a second embodiment of the present invention.

A second embodiment of the present invention is illustrated in FIG. 7. Since the embodiment of the invention illustrated in FIG. 7 is generally similar to the embodiment illustrated in FIGS. 1–6, similar reference is numerals are utilized to designate similar components, the suffix letter "a" being associated with the embodiment of FIG. 7 to avoid confusion.

The resistor 16a comprises two resistor portions 100, 102 which have different geometries and/or resistances. Each of the resistor portions 100, 102 is made using a different thermal transfer ribbon. Each thermal transfer ribbon has a coating having a different degree of electrical conductivity from the other ribbons. Each of the resistor portions 100, 102 is printed on the printed circuit board 10a using the thermal transfer techniques and the computer system 20 of FIG. 2 described hereinabove with respect to the first embodiment.

The printer controls 44 of the computer system 20 of FIG. 2 also select the thermal transfer ribbon used for printing each resistor portion for this embodiment. One of the ribbons may have a much higher degree of electrical conductivity than the other ribbons, enabling the conductive traces 12*a* to also be printed using thermal transfer techniques as described hereinabove with respect to the first embodiment.

An additional advantage of this embodiment includes the ability to provide resistors having a wider selection of resistances while still meeting the geometry constraints of the printed circuit board. Although the present invention has been described above in detail, the same is by way of illustration and example only and is not to be taken as a limitation on the present invention. Accordingly, the scope and content of the present invention are to be defined only by the terms of the appended claims.

What is claimed is:

1. A method of printing a resistor on a printed circuit board comprising the steps of:
    a) positioning a ribbon having a thermally active coating having electrical conductivity over the printed circuit board;
    b) applying heat to a portion of said ribbon causing a part of said coating to transfer to the printed circuit board, forming at least a part of a resistor; and
    c) repeating steps a) and b) for varying portions of the printed circuit board and the ribbon until the resistor has been formed on the printed circuit board.

2. The method of claim 1 wherein said resistor comprises part of a coating including conductive polymers.

3. The method of claim 1 wherein said resistor comprises part of a coating including non-conductive polymers filled with conductive pigment.

4. The method of claim 3 wherein said conductive pigment is carbon black.

5. A method of printing a resistor on a printed circuit board, comprising the steps of:
    a) instructing printer controls where to locate the resistor on the printed circuit board;
    b) positioning a ribbon with a thermally reactive coating having electrical conductivity over a portion of the printed circuit board;
    c) applying heat to a portion of the ribbon using a thermal printhead, such that the heat causes a part of the coating to transfer to the printed circuit board; and
    d) repeating steps b) and c) for varying portions of the printed circuit board and the ribbon as instructed by the printer controls until the resistor has been formed on the printed circuit board.

6. The method of claim 5 wherein the step of instructing printer controls further includes receiving instructions from a computer in communication with the printer controls.

7. A method of printing a resistor on a printed circuit board using a plurality of thermal transfer ribbons wherein each ribbon has a coating having a different degree of electrical conductivity, comprising the steps of:
    a) instructing printer controls where to locate the resistor;
    b) positioning one of the plurality of ribbons over a portion of the printed circuit board;
    c) applying heat to a portion of the ribbon using a thermal printhead, wherein the heat causes a part of the coating to transfer to the printed circuit board; and
    d) repeating steps b) and c) for varying portions of the printed circuit board and varying ribbons as instructed by the printer controls until the resistor has been formed on the printed circuit board.

8. The method of claim 7 wherein the step of instructing printer controls further includes receiving instructions from a computer in communication with the printer controls.

9. A method of printing a part of a resistor on a printed circuit board comprising the steps of:
    a) positioning a ribbon having a thermally active coating having electrical conductivity over the printed circuit board; and
    b) applying heat to a portion of said ribbon causing part of said coating to transfer to the printed circuit board, forming a part of a resistor.

10. The method of claim 9 wherein said resistor comprises part of a coating including conductive polymers.

11. The method of claim 9 wherein said resistor comprises part of a coating including non-conductive polymers filled with conductive pigment.

12. The method of claim 11 wherein said conductive pigment is carbon black.

13. A method of printing a resistor on a printed circuit board comprising the steps of:
    a) positioning a ribbon having a thermally active coating having electrical conductivity over the printed circuit board;
    b) applying heat to a portion of said ribbon causing a part of said coating to transfer directly to a nonconductive surface of the printed circuit board, forming at least a part of a resistor which is raised in a plane different than the nonconductive surface of the printed circuit board; and
    c) repeating steps a) and b) for varying portions of the printed circuit board and the ribbon until the resistor has been formed on the printed circuit board.

14. The method of claim 13 wherein said resistor comprises part of a coating including wax.

15. A method of printing a part of a resistor on a printed circuit board comprising the steps of:
    a) positioning a ribbon having a thermally active coating having electrical conductivity over the printed circuit board; and
    b) applying heat to a portion of said ribbon causing part of said coating to transfer directly to a nonconductive surface of the printed circuit board, forming a part of a resistor which is raised in a plane different than the nonconductive surface of the printed circuit board.

* * * * *